United States Patent
Goel et al.

(10) Patent No.: US 9,835,680 B2
(45) Date of Patent: Dec. 5, 2017

(54) METHOD, DEVICE AND COMPUTER PROGRAM PRODUCT FOR CIRCUIT TESTING

(71) Applicant: TAIWAN SEMICONDUCTOR MANUFACTURING COMPANY, LTD., Hsinchu (TW)

(72) Inventors: Sandeep Kumar Goel, Dublin, CA (US); Yun-Han Lee, Baoshan Township (TW); Saman M. I. Adham, Kanata (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 224 days.

(21) Appl. No.: 14/659,064

(22) Filed: Mar. 16, 2015

(65) Prior Publication Data
US 2016/0274178 A1 Sep. 22, 2016

(51) Int. Cl.
*G01R 31/28* (2006.01)
*G01R 31/30* (2006.01)
*G01R 31/3183* (2006.01)

(52) U.S. Cl.
CPC . *G01R 31/3008* (2013.01); *G01R 31/318307* (2013.01)

(58) Field of Classification Search
CPC .......... G01R 31/3008; G01R 31/3004; G01R 31/318307; G01R 31/2884; G01R 31/31924; G01R 31/31922; G01R 31/318511; G01R 31/318505; G01R 31/2831; G01R 31/318513; G01R 31/31905; G01R 31/2632; G01R 31/2635; G01R 31/2608; G01R 31/2614; G01R 31/2621; G01R 31/275; G01R 31/021; G01R 31/025; G01R 31/08083
(Continued)

(56) References Cited

U.S. PATENT DOCUMENTS 5,321,354 A * 6/1994 Ooshima ............. G06F 11/2273
324/762.09
6,377,901 B1 * 4/2002 List .................... G01R 31/3016
702/117
(Continued)

FOREIGN PATENT DOCUMENTS

CN 101960511 1/2011
JP H10143386 5/1998
(Continued)

OTHER PUBLICATIONS

Office Action dated Jul. 4, 2016 and English translation from corresponding No. KR 10-2015-0096667.
(Continued)

*Primary Examiner* — Thang Le
(74) *Attorney, Agent, or Firm* — Hauptman Ham, LLP

(57) ABSTRACT

A method performed at least partially by a processor includes performing a test sequence. In the test sequence, a test pattern is loaded into a circuit. The test pattern is configured to cause the circuit to output a predetermined test response. A test response is unloaded from the circuit after a test wait time period has passed since the loading of the test pattern into the circuit. The unloaded test response is compared with the predetermined test response.

20 Claims, 10 Drawing Sheets

(58) Field of Classification Search
USPC .................. 324/762.01, 762.02, 762.03, 324/762.05–762.09, 527, 528, 750.01, 324/750.03
See application file for complete search history.

(56) References Cited

U.S. PATENT DOCUMENTS

| | | | |
|---|---|---|---|
| 8,516,316 B2* | 8/2013 | Lam | G01R 31/318541 714/726 |
| 8,601,416 B2 | 12/2013 | Kuo et al. | |
| 8,762,900 B2 | 6/2014 | Shin et al. | |
| 8,775,993 B2 | 7/2014 | Huang et al. | |
| 8,887,116 B2 | 11/2014 | Ho et al. | |
| 2001/0041967 A1 | 11/2001 | Nakayama | |
| 2002/0190706 A1* | 12/2002 | Ebiya | G01R 31/3191 324/762.01 |
| 2003/0115517 A1 | 6/2003 | Rutten | |
| 2004/0139376 A1 | 7/2004 | Ohta et al. | |
| 2006/0129335 A1* | 6/2006 | Niijima | G01R 31/31922 702/35 |
| 2010/0271063 A1* | 10/2010 | Hasegawa | G11C 29/56008 324/756.04 |
| 2011/1099355 | 8/2011 | Watanabe et al. | |
| 2011/0227600 A1* | 9/2011 | Baeg | G01R 31/31721 324/762.01 |
| 2014/0101623 A1 | 4/2014 | Chen et al. | |
| 2014/0201692 A1 | 7/2014 | Chen et al. | |
| 2014/0237435 A1 | 8/2014 | Chen et al. | |
| 2014/0282337 A1 | 9/2014 | Yuh et al. | |
| 2014/0304670 A1 | 10/2014 | Su et al. | |
| 2014/0310675 A1 | 10/2014 | Liu et al. | |
| 2014/0325464 A1 | 10/2014 | Hsu et al. | |

FOREIGN PATENT DOCUMENTS

| | | |
|---|---|---|
| JP | 2005513444 | 5/2005 |
| JP | 2007292493 | 11/2007 |
| KR | 2000-0076281 | 12/2000 |
| KR | 2001-0098951 | 11/2001 |
| TW | 538252 | 6/2003 |

OTHER PUBLICATIONS

Office Action dated Dec. 26, 2016 from corresponding No. TW 104129608.
Notice of Allowance dated Apr. 20, 2017 and English translation from corresponding No. KR 10-2015-0096667.

* cited by examiner

METHOD, DEVICE AND COMPUTER PROGRAM PRODUCT FOR CIRCUIT TESTING

BACKGROUND

The recent trend in miniaturizing integrated circuits (ICs) has resulted in smaller devices which consume less power, yet provide more functionality at higher speeds. The miniaturization process has also resulted in stricter design and/or manufacturing specifications. Such stricter design and/or manufacturing specifications potentially induce defects in manufactured devices. Various testing techniques are developed to detect and/or locate defects in the manufactured devices to screen out defective devices and ensure desired production yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
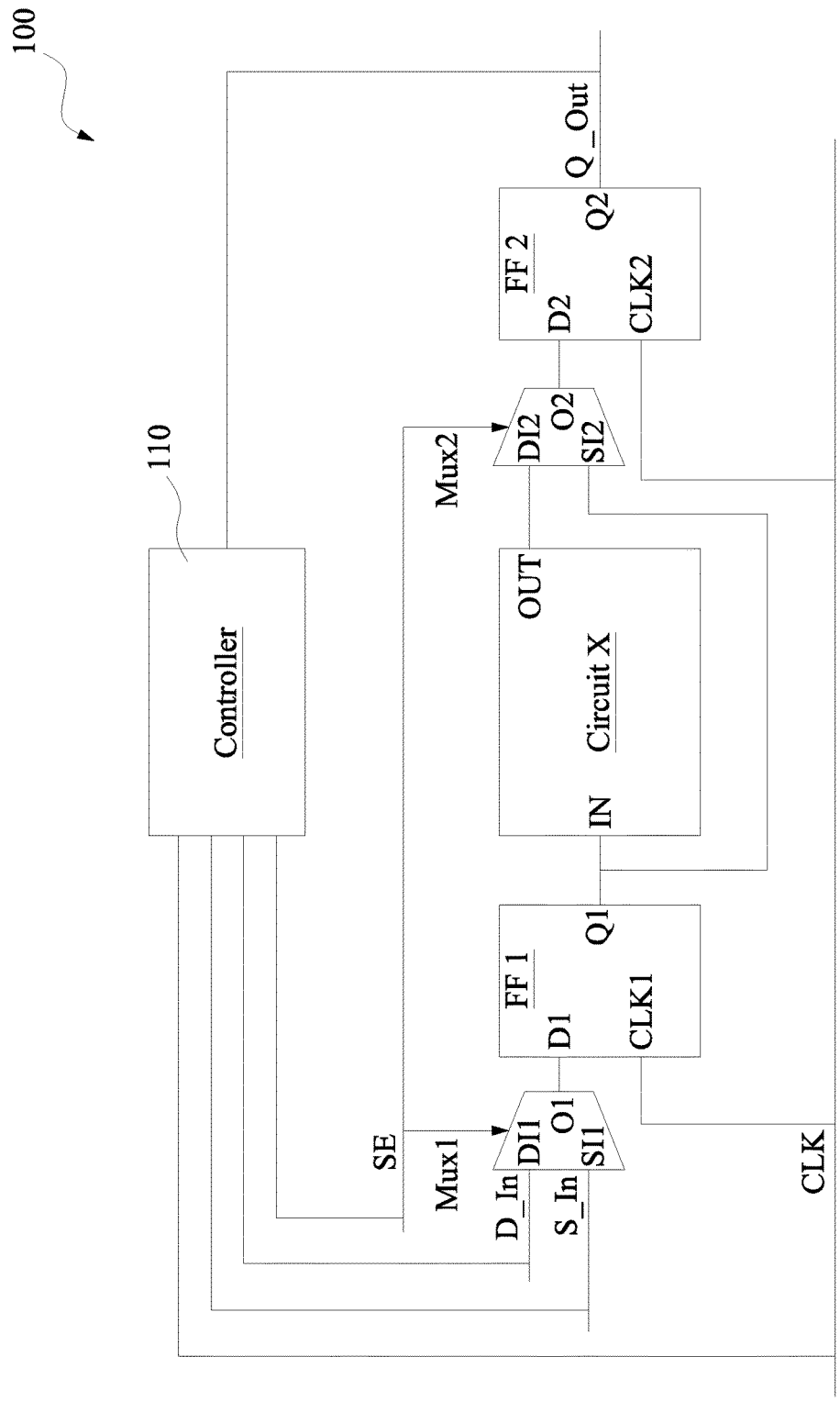
FIG. 1 is a schematic circuit diagram of a circuit testing device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic circuit diagram of a circuit testing device 100, in accordance with some embodiments. The circuit testing device 100 comprises a circuit X, multiplexers Mux1 and Mux2, flip-flops FF1 and FF2, and a controller 110. The circuit X is a circuit under test (CUT) which is to be tested for defects. In some embodiments, the circuit X is a part of a larger IC, and the circuit testing device 100 is a portion of a larger circuit testing system configured to test various circuits of the larger IC.

In some embodiments, the circuit X comprises at least one active element and/or at least one passive element. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, and the like. Examples of passive elements include, but are not limited to, capacitors, inductors, fuses, and resistors. In some embodiments, the active and/or passive elements in the circuit X are interconnected with each other to form one or more logic elements configured to provide one or more logic functions that the circuit X is designed to perform. Examples of logic elements include, but are not limited to, AND gates, OR gates, NAND gates, NOR gates, XOR gates, XNOR gates, NOT gates (inverters) and the like, as well as combinations thereof.

The multiplexer Mux1 comprises a data input DI1 configured to receive an input data signal D_In, a scan input SI1 configured to receive an input scan signal S_In, a control input configured to receive a scan enabling signal SE, and an output O1. The flip-flop FF1 comprises an input D1 coupled to the output O1 of the multiplexer Mux1, an output Q1 and a clock signal input CLK1 configured to receive a clock signal CLK. The circuit X comprises an input IN coupled to the output Q1 of the flip-flop FF1, and an output OUT. The multiplexer Mux2 comprises a data input DI2 coupled to the output OUT of the circuit X, a scan input SI2 coupled to the input IN of the circuit X, a control input configured to receive the scan enabling signal SE, and an output O2. The flip-flop FF2 comprises an input D2 coupled to the output O2 of the multiplexer Mux2, an output Q2 and a clock signal input CLK2 configured to receive the clock signal CLK. The output Q2 is configured to output an output signal Q_Out corresponding to the data signal D_In, or the input scan signal S_In, as described herein. The described configuration is an example. Other arrangements are within the scope of various embodiments. For example, in one or more embodiments, the flip-flop FF1 and/or flip-flop FF2 is/are replaced by one or more other circuits, such as latching circuits, which are configured to have data retention capability.

In some embodiments, the circuit X comprises more than one input and/or more than one output. For each of the inputs of the circuit X, the circuit testing device 100 in one or more embodiments comprises a corresponding input circuit of a multiplexer and a flip-flop coupled to the corresponding input IN as described with respect to the multiplexer Mux1 and flip-flop FF1 in FIG. 1. The input circuits are serially connected such that the output of the flip-flop in a preceding input circuit is coupled to the scan input of the multiplexer in the subsequent input circuit. For each of the outputs of the circuit X, the circuit testing device 100 in one or more embodiments comprises a corresponding output circuit of a multiplexer and a flip-flop coupled to the corresponding output OUT as described with respect to the multiplexer Mux2 and flip-flop FF2 in FIG. 1. The output circuits are serially connected such that the output of the flip-flop in a preceding output circuit is coupled to the scan input of the multiplexer in the subsequent output circuit. Other arrangements are within the scope of various embodiments.

The controller 110 is configured to supply one or more of the input data signal Din, input scan signal S_In, the clock signal CLK, and the scan enabling signal SE, and/or to receive the output signal Q_Out. In at least one embodiment, the controller 110 is configured to perform a testing process on the circuit X, and is configured to supply the input scan signal S_In, scan enabling signal SE, and clock signal CLK, and to receive and analyze the output signal Q_Out. In at least one embodiment, the controller 110 is at least partially implemented on-chip, i.e., on the same die or integrated circuit as the circuit X under test. An example on-chip arrangement includes a self-test chip which is configured to perform one or more testing processes described herein without involving external testing equipment. In at least one embodiment, the controller 110 is implemented off-chip, e.g., in automated testing equipment (ATE) coupled to the circuit X via one or more probes which is/are brought into contact with corresponding one or more primary inputs/outputs (IOs) of the IC comprising the circuit X.

In an example operation of the circuit testing device 100 in accordance with some embodiments, the multiplexer Mux1 and multiplexer Mux2 selectively pass the signals at the corresponding data inputs or signals at the corresponding scan inputs to the corresponding flip-flop FF1 and flip-flop FF2 depending on the scan enabling signal SE. For example, in a normal operation of the circuit X in accordance with some embodiments, the controller 110 sets the scan enabling signal SE at a first logic state, e.g., logical "0." In response to the scan enabling signal SE having logical "0," the multiplexer Mux1 passes the input data signal D_In to the input D1 of the flip-flop FF1. The flip-flop FF1 sends the input data signal D_In to the output Q1 in accordance with the clock signal CLK. The circuit X generates, at the output OUT, output data corresponding to input data in the input data signal D_In. The multiplexer Mux2 passes the output data to the input D2 of the flip-flop FF2. The flip-flop FF2 outputs the output data at the output Q2 as the output signal Q_Out in accordance with the clock signal CLK.

In a testing process of the circuit X in accordance with some embodiments, the controller 110 sets the scan enabling signal SE at a second logic state, e.g., logical "1." In response to the scan enabling signal SE having logical "1," the multiplexer Mux1 passes the input scan signal S_In to the input D1 of the flip-flop FF1. The flip-flop FF1 sends the input scan signal S_In to the output Q1 in accordance with the clock signal CLK. The circuit X generates, at the output OUT, test response data corresponding to test data in the input scan signal S_In. The multiplexer Mux2 passes the test response data to the input D2 of the flip-flop FF2. The flip-flop FF2 outputs the test response data at the output Q2 as the output signal Q_Out in accordance with the clock signal CLK. The controller 110 is configured to compare the test data in the input scan signal S_In with the test response data in the output signal Q_Out to detect a defect in the circuit X.

Figure 2A:
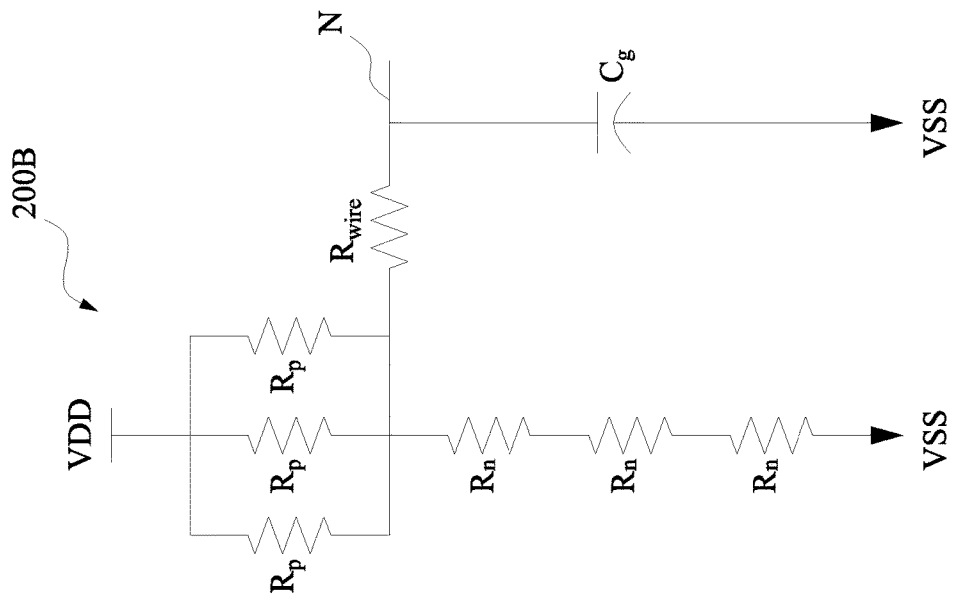
FIG. 2A is a schematic circuit diagram of an example circuit under test (CUT), in accordance with some embodiments.

FIG. 2A is a schematic circuit diagram of an example circuit 200A of the circuit X, in accordance with some embodiments. The circuit 200A in FIG. 2A is an example. Other circuit configurations of the circuit X are within the scope of various embodiments. The circuit 200A includes p-channel metal-oxide semiconductor (PMOS) transistors MP1, MP2 and MP3, and n-channel metal-oxide semiconductor (NMOS) transistors MN1, MN2 and MN3. The PMOS transistors MP1, MP2 and MP3 are coupled in parallel between a first node of a first power supply voltage VDD and a node N. The NMOS transistors MN1, MN2 and MN3 are coupled in series between the node N and a second node of a second power supply voltage VSS. In at least one embodiment, the second power supply voltage VSS is the ground voltage. Other arrangements are within the scope of various embodiments. In at least one embodiment, the node N corresponds to the output node OUT of the circuit X, and one or more of the gates of the transistors MP1, MP2, MP3, MN1, MN2 and MN3 correspond(s) to one or more input(s) IN of the circuit X. Although PMOS and NMOS transistors are described herein with respect to some embodiments, other types of transistors, such as normally-open and normally closed transistors, are within the scope of various embodiments.

Figure 2B:
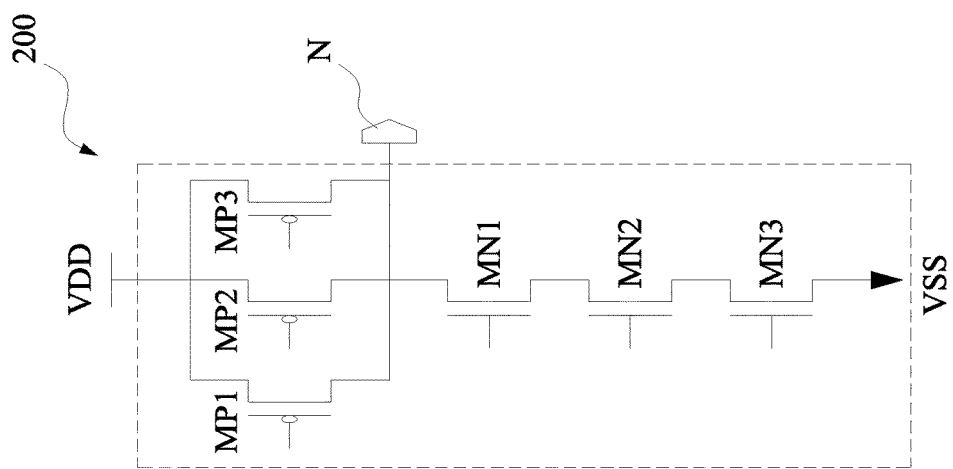
FIG. 2B is a schematic, equivalent circuit diagram of the CUT of FIG. 2A, in accordance with some embodiments

FIG. 2B is a schematic, equivalent circuit diagram 200B of the circuit 200A, in accordance with some embodiments. The PMOS transistors MP1, MP2 and MP3 and NMOS transistors MN1, MN2 and MN3 are represented in the equivalent circuit diagram 200B by corresponding ON-state resistance of the transistors. For simplicity, the PMOS transistors MP1, MP2 and MP3 are assumed to have the same ON-state resistance Rp, the NMOS transistors MN1, MN2 and MN3 are assumed to have the same ON-state resistance Rn, as illustrated in FIG. 2B. Other resistance arrangements are within the scope of various embodiments. A load capacitance and a load resistance of a conductor or wiring connecting the node N to other circuitry are presented in the equivalent circuit diagram 200B by a corresponding capacitance Cg and a corresponding resistance Rwire.

Figure 2D:
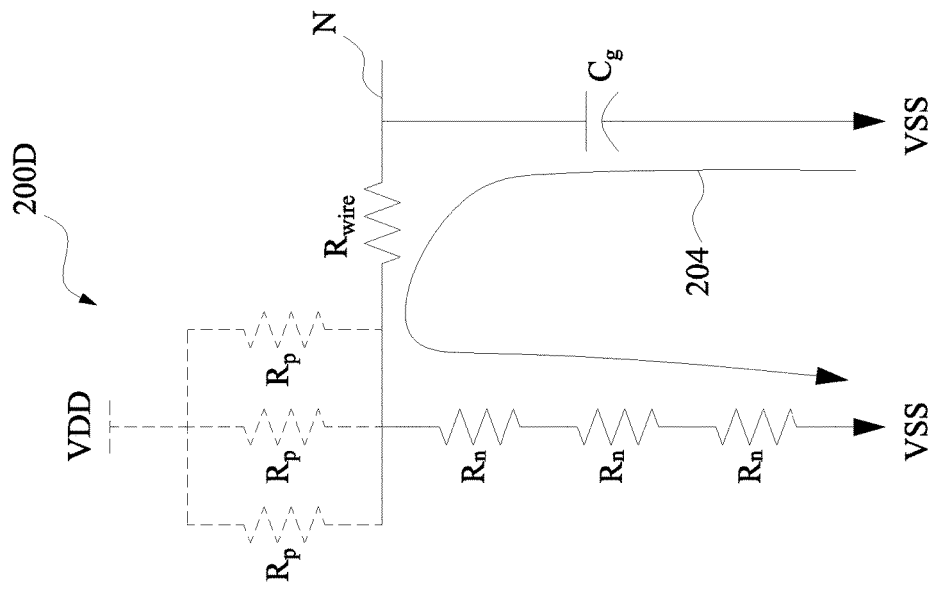
FIGS. 2C-2E are schematic, equivalent circuit diagrams of the CUT of FIG. 2A in various states, in accordance with some embodiments.
Figure 2C:
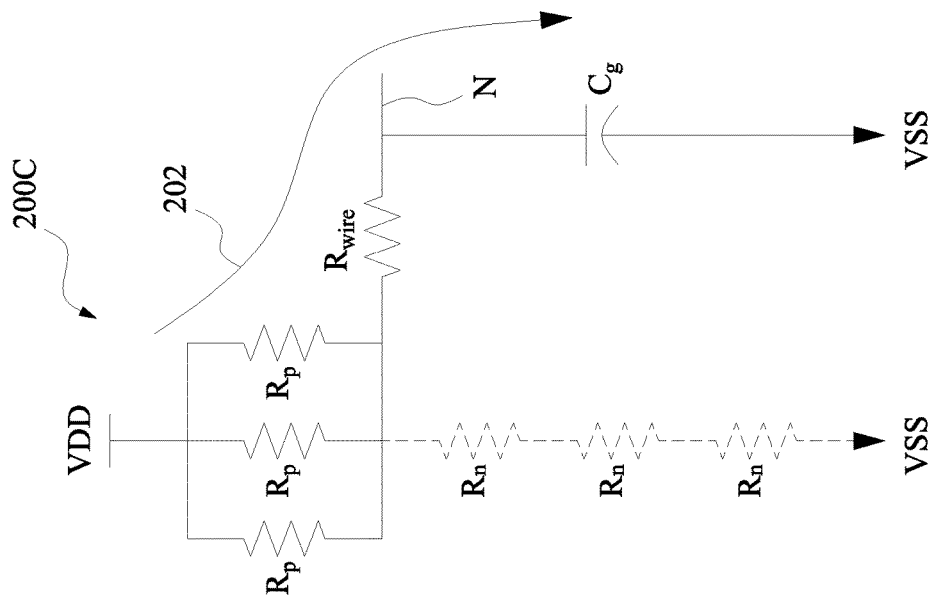

FIG. 2C is a schematic, equivalent circuit diagram 200C of the circuit 200A, when the node N is charged to have a voltage corresponding to logical "1," in accordance with some embodiments. For example, to bring the node N to the power supply voltage VDD corresponding to logical "1," the PMOS transistors MP1, MP2 and MP3 are turned ON and the NMOS transistors MN1, MN2 and MN3 are turned OFF. In the equivalent circuit diagram 200C, the resistances Rp corresponding to turned ON PMOS transistors MP1, MP2 and MP3 are illustrated in solid line, and the resistances Rn corresponding to turned OFF NMOS transistors MN1, MN2 and MN3 are illustrated in dot-dot line. The power supply voltage VDD is applied via turned ON PMOS transistors MP1, MP2 and MP3 to charge the node N to the logical "1," as indicated by an arrow 202. A logical "1" charging time $\tau(1)$ is determined by the following equation:

$$\tau(1) = \left(R_{wire} + \frac{R_p}{NP_g}\right)C_g \quad (1)$$

where NPg is the number of turned ON PMOS transistors.

FIG. 2D is a schematic, equivalent circuit diagram 200D of the circuit 200A, when the node N is charged to have a voltage corresponding to logical "0," in accordance with some embodiments. For example, to bring the node N to the ground voltage VSS corresponding to logical "0," the PMOS transistors MP1, MP2 and MP3 are turned OFF and the NMOS transistors MN1, MN2 and MN3 are turned ON. In the equivalent circuit diagram 200D, the resistances Rp corresponding to turned ON PMOS transistors MP1, MP2 and MP3 are illustrated in dot-dot line, and the resistances Rn corresponding to turned OFF NMOS transistors MN1, MN2 and MN3 are illustrated in solid line. The node N is discharged via turned ON NMOS transistors MN1, MN2 and MN3 to the ground voltage VSS discharged to the logical "0," as indicated by an arrow 204. A logical "0" discharging time τ(0) is determined by the following equation:

$$\tau(0) = (R_{wire} + NN_g \times R_n) C_g \qquad (2)$$

where NNg is the number of turned ON NMOS transistors.

The equation (1) also describes a situation when there is a defect, e.g., a leakage current, in the circuit 200A. In at least one embodiment, a leakage current occurs when a transistor is turned ON (i.e., conductive) even though such a transistor is expected to be turned OFF. For example, after the node N is discharged to the ground voltage VSS or logical "0" as described with respect to FIG. 2D and all transistors in the circuit 200A are turned OFF, the ground voltage VSS or logical "0" is expected to remain on the node N. However, due to a current leakage in one or more defective transistor(s) among the PMOS transistors MP1, MP2 and MP3, which are supposed to be turned OFF, the voltage at the node N is charged by the power supply voltage VDD via the one or more defective PMOS transistors. When the voltage on node N, which is expected to remain at the ground voltage VSS, is charged to the power supply voltage VDD, the logic state of the node N is flipped from logical "0" to logical "1." The time period for the logic state of the node N to flip is described by the equation (1) in which NPg indicates the number of defective PMOS transistors.

The equation (2) also describes another situation when there is a defect, e.g., a leakage current, in the circuit 200A. For example, after the node N is charged to the power supply voltage VDD or logical "1" as described with respect to FIG. 2C and all transistors in the circuit 200A are turned OFF, the power supply voltage VDD or logical "1" is expected to remain on the node N. However, due to a current leakage in one or more defective transistor(s) among the NMOS transistors MN1, MN2 and MN3, which are supposed to be turned OFF, the voltage at the node N is discharged to the ground voltage VSS via the one or more defective NMOS transistors. When the voltage on node N, which is expected to remain at the power supply voltage VDD, is discharged to the ground voltage VSS, the logic state of the node N is flipped from logical "1" to logical "0." The time period for the logic state of the node N to flip is described by the equation (2) in which NNg indicates the number of defective NMOS transistors.

Figure 2E:
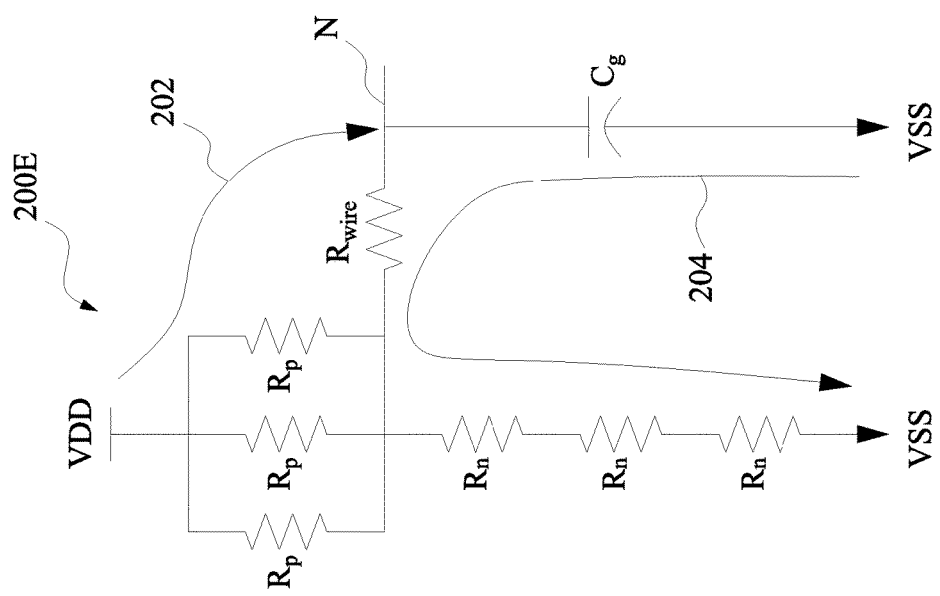

FIG. 2E is a schematic, equivalent circuit diagram 200E of the circuit 200A, when there are defects among the PMOS transistors and among the NMOS transistors. The voltage at the node N is charged and discharged at the same time due to the defective PMOS transistor(s) and the defective NMOS transistor(s). The time period for the logic state of the node N to flip is described by the following equation:

$$\tau(\text{faulty}) = \left( Rwire + 1 \Big/ \left( \frac{1}{NN_g \times Rn} + \frac{NP_g}{R_p} \right) \right) \times C_g \qquad (3)$$

where NPg is the number of defective PMOS transistors, and NNg is the number of defective NMOS transistors. The flipping of the logic state at the node N due to a defect in the circuit 200A is used in a testing process in accordance with some embodiments to detect the defect.

Figure 3:
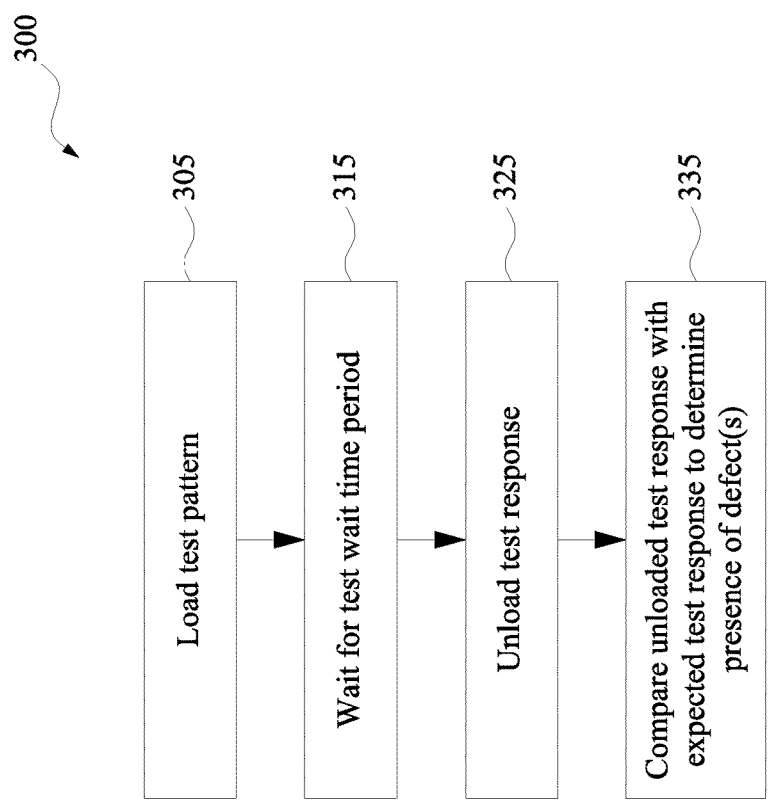
FIG. 3 is a flow chart of a testing process, in accordance with some embodiments.

FIG. 3 is a flow chart of a testing process 300, in accordance with some embodiments. In at least one embodiment, the testing process 300 is performed by the controller 110 to detect a defect in the circuit X described with respect to FIG. 1. In the following description, the circuit X is assumed to have the configuration of the circuit 200A described with respect to FIG. 2A.

At operation 305, a test pattern is loaded by the controller 110 to the circuit 200A to cause the circuit to output a predetermined test response. In at least one embodiment, a test pattern is supplied by the controller 110 to the circuit 200A to cause the node N to have a predetermined logic state. In a first example, the test pattern includes values corresponding to signals applied to the gates of the transistors in the circuit 200A, so as to turn ON the NMOS transistors and to turn OFF the PMOS transistors to discharge the voltage on the node N to the ground voltage VSS and to cause the node N to have logical "0." Logical "0" at the node N includes the predetermined test response in the first example. In a second example, the test pattern includes values corresponding to signals applied to the gates of the transistors in the circuit 200A, so as to turn OFF the NMOS transistors and to turn ON the PMOS transistors to charge the voltage on the node N to the power supply voltage VDD and to cause the node N to have logical "1." Logical "1" at the node N includes the predetermined test response in the second example.

At operation 315, the controller 110 waits for a test wait time period, before unloading an actual test response from the circuit 200A at operation 325. In at least one embodiment, the test wait time period is sufficient for the predetermined test response outputted by the circuit 200A to change in response to a defect in the circuit 200A. In the first example, when the predetermined logic state at the node N is logical "0," the test wait time period is sufficient for logical "0" at the node N to flip to logical "1" due to a defect in one or more of the PMOS transistors. As a result, after the test wait time period, the actual logic state at the node N is logical "0" when there is no defect among the PMOS transistors, and is logical "1" when there is at least one defective PMOS transistor in the circuit 200A. In at least one embodiment, the test wait time period T0 for detecting a defect among PMOS transistors is a logic state flipping time period for the node N to flip from logical "0" to logical "1" and is determined as follows:

$$T0 = \max(\tau(\text{faulty}), \tau(1)) \qquad (4)$$

In the second example, when the predetermined logic state at the node N is logical "1," the test wait time period is sufficient for logical "1" at the node N to flip to logical "0" due to a defect in one or more of the NMOS transistors. As a result, after the test wait time period, the actual logic state at the node N is logical "1" when there is no defect among the NMOS transistors, and is logical "0" when there is at least one defective NMOS transistor in the circuit 200A. In at least one embodiment, the test wait time period T1 for detecting a defect among NMOS transistors is a logic state flipping time period for the node N to flip from logical "1" to logical "0" and is determined as follows:

$$T1 = \max(\tau(\text{faulty}), \tau(0)) \qquad (5)$$

At operation 325, the actual test response is unloaded from the circuit 200A and, at operation 335, the unloaded test response is compared with the predetermined test response. When the actual logic state at the node N matches the predetermined logic state, it is determined that there is no corresponding defect in the circuit 200A; otherwise, it is determined that there is a corresponding defect in the circuit 200A. In the first example, when the actual logic state at the node N is logical "0" which matches the predetermined logic state, it is determined that there is no defect among the PMOS transistors in the circuit 200A; otherwise, it is determined that there is at least one defective PMOS transistor. In the second example, when the actual logic state at the node N is logical "1" which matches the predetermined logic state, it is determined that there is no defect among the NMOS transistors in the circuit 200A; otherwise, it is determined that there is at least one defective NMOS transistor.

In some embodiments, the described testing process permits detection of a defect in a circuit by loading a test pattern into the circuit, unloading an actual test response from the circuit after a test wait time period, and comparing the unloaded test response with a predetermined or expected test response. Compared to other approaches where defects in a circuit are detected by measuring a leakage current in the circuit, the testing process in one or more embodiments does not rely on leakage current measurements. The testing process in accordance with some embodiments is also scalable to advanced nodes where direct current measurement based techniques in accordance with other approaches are potentially not effective. The testing process in accordance with some embodiments is further compatible with standard and/or existing ATE and design for test (DFT) methodology, without involving modifications to the testing equipment and/or on-chip test structures and without impact on functional timing of the CUT.

Figure 4:
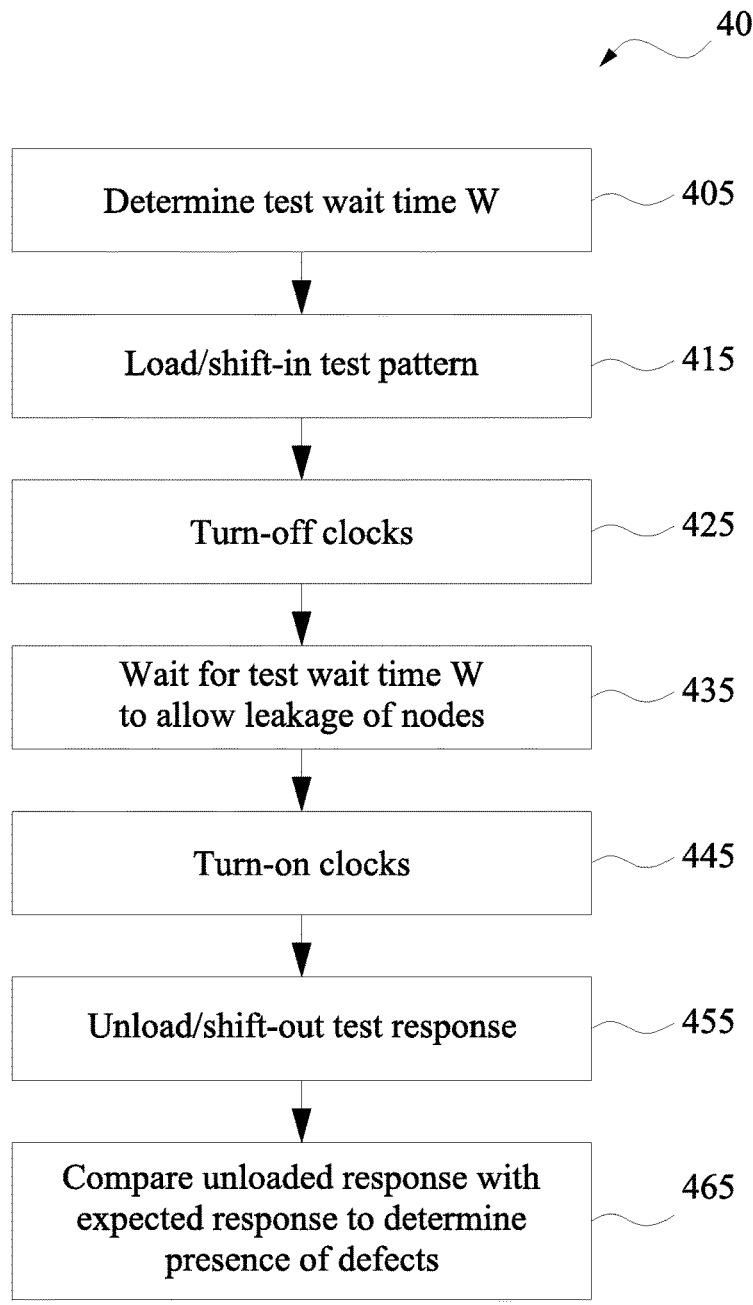
FIG. 4 is a flow chart of a testing process, in accordance with some embodiments.
Figure 5:
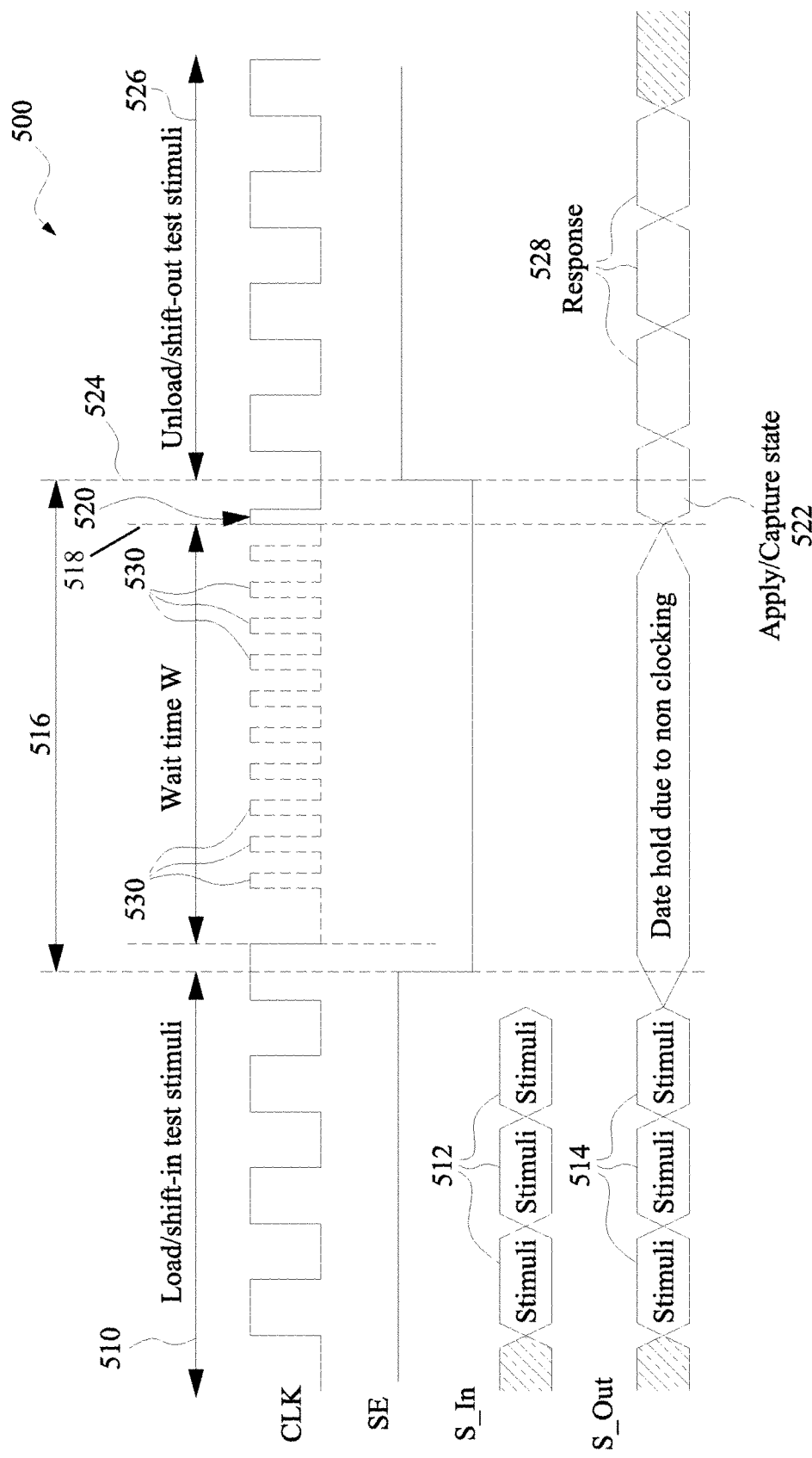
FIG. 5 is a timing diagram showing various signals during a testing process, in accordance with some embodiments.

FIG. 4 is a flow chart of a testing process 400, in accordance with some embodiments. FIG. 5 is a timing diagram 500 showing various signals during the testing process 400, in accordance with some embodiments. In at least one embodiment, the testing process 400 is performed by the controller 110 to detect a defect in the circuit X described with respect to FIG. 1. In the description below with reference to FIGS. 1, 4 and 5, the defect to be detected is a defect in one or more of PMOS transistors in the circuit X in accordance with some embodiments. In at least one embodiment, the testing process 400 is also applicable to detect a defect in one or more NMOS transistors of the circuit X in a similar manner.

At operation 405 in FIG. 4, a test wait time period W is determined, based on a logic state flipping time period for a node in a circuit to change from a first logic state to a second logic state due to current leakage in the circuit. For example, to determine a defect among the PMOS transistors, a test wait time period W0 is determined, based on a logic state flipping time period for a node, e.g., the output node OUT, in the circuit X to change from logical "0" to a logical "1" due to current leakage in one or more PMOS transistors in the circuit X. In at least one embodiment, W0 is determined as T0 described with respect to the equation (4). For example, when T0 is determined by time value, e.g., 1.2 picoseconds (ps), W0 is also a time value, e.g., 1.2 ps. In at least one embodiment, the time value of T0 is converted to a corresponding number of clock cycles which is used as W0. In an example, when the time value of T0 is 1.2 ps and at a clock cycle of 0.5 ps of a capture clock pulse described herein, W0 is determined to be 3 clock cycles corresponding to 1.5 ps which is greater than T0 and is sufficient to permit logical "0" of the output node OUT to flip when there is a defective PMOS transistor in the circuit X. In another example, the W0 is determined to be 2 clock cycles corresponding to 1.0 ps. Although W0 equal to 2 clock cycles is shorter than T0, such that the test wait time period W0 is still sufficient, in at least one embodiment, to permit logical "0" of the output node OUT to flip when there is a defective PMOS transistor in the circuit X, because the logic state at the output node OUT is flipped to logical "1" when the voltage on the output node OUT is sufficiently high but does not yet reach the power supply voltage VDD. Other arrangements for determining the test wait time period W0 are within the scope of various embodiments.

At operation 415 in FIG. 4, a test pattern (also referred to herein as test stimuli) is loaded into the circuit to cause the node in the circuit to have a predetermined or expected logic state. For example, a test pattern is loaded by the controller 110 into the circuit X to cause the output node OUT to have logical "0." As illustrated in FIG. 5, during a test pattern loading period 510, the scan enabling signal SE applied to the multiplexers Mux1 and Mux2 is at logical "1", the clock signal CLK is applied to the flip-flops FF1 and FF2, and the test pattern 512 is applied as the input scan signal S_In to the multiplexer Mux1. The scan enabling signal SE of logical "1" causes the multiplexer Mux1 to output the test pattern 512 on the scan input SI1 to the flip-flop FF1 which, in turn, latches the test pattern 512 in accordance with the clock signal CLK. The test pattern 512 is loaded into the circuit X to cause the output node OUT to have logical "0." The logic state of the output node OUT; however, is not outputted to the controller 110, because the scan enabling signal SE of logical "1" causes the multiplexer Mux2 to output the signal on the scan input SI2, instead of the signal on the data input DI2 coupled to the output node OUT of circuit X. Because the scan input SI2 of the multiplexer Mux2 is coupled to the output Q1 of the flip-flop FF1, the scan input SI2 of the multiplexer Mux2 receives the test pattern 512 from the output Q1, and the test pattern 512 is outputted by the multiplexer Mux2 to the flip-flop FF2. The flip-flop FF2 outputs the test pattern 512, in accordance with the clock signal CLK, as output patterns 514 in the output signal Q_Out. In some embodiments where the circuit X includes multiple inputs, the flip-flops corresponding to the inputs of the circuit X are coupled in series to sequentially latch multiple bits in the test pattern 512 into the corresponding flip-flop circuits.

At operation 425 in FIG. 4, a clock signal of the circuit is stopped. The clock signal is stopped for the determined test wait time period, as indicated at operation 435 in FIG. 4. For example, the clock signal CLK is stopped by the controller 110 during a test wait time period W. As illustrated in FIG. 5, clock pulses of the clock signal CLK are shown in dot-dot line during the test wait time period W to indicate that the clock signal CLK is stopped. In at least one embodiment, the clock signal CLK is still generated by a clock generating circuit, but is not applied to the flip-flops FF1 and FF2. The circuit X is still powered during the test wait time period W to permit a logic state of a node of the circuit X to flip when a circuit defect exists. In the example arrangement in accordance with some embodiments as illustrated in FIG. 5, the scan enabling signal SE is at logical "0" during a period 516 overlapping the test wait time period W. Because the scan enabling signal SE is at logical "0," the logic state at the output node OUT coupled to the data input DI2 of the multiplexer Mux2 is supplied to the input D2 of the flip-flop FF2 via the output O2 of the multiplexer Mux2. However, in the absence of the clock signal CLK, the flip-flops FF1 and FF2 do not latch data at corresponding inputs D1 and D2, and do not output such data at the corresponding outputs Q1 and Q2. As a result, the logic state of the output node OUT of the circuit X, although presented at the input D2, is not latched into and is not outputted by the flip-flop FF2 while the clock signal CLK is stopped.

As described herein, the test wait time period W during which the clock signal CLK is stopped is determined in one or more embodiments to permit the logic state at the output node OUT to flip when there is a corresponding defect in the circuit X. For example, when the test pattern 512 is configured to cause the output node OUT to have logical "0" and there is a defective PMOS transistor in the circuit X, the corresponding test wait time period W0 is sufficient for the output node OUT to flip from logical "0" to logical "1" due to current leakage through the defective PMOS transistor. The flipped logic state is supplied to the input D2 but is not yet latched into and outputted by the flip-flop FF2 while the clock signal CLK is still stopped. When there is no defect among the PMOS transistors of the circuit X, the logic state of the output node OUT remains at the expected logical "0" and is inputted to the input D2, but not yet latched into and outputted by the flip-flop FF2.

At operation 445 in FIG. 4, the clock signal is resumed after the test wait time period W. For example, as illustrated in FIG. 5, the clock signal CLK is resumed at a timing 518. A capture clock pulse 520, which is the first clock pulse of the resumed clock signal CLK, is supplied to the flip-flops FF1 and FF2 while the scan enabling signal SE is at logical "0." The capture clock pulse 520 latches the logic state of the output node OUT of the circuit X at the input D2 into the flip-flop FF2. A previous logic state latched in the flip-flop FF2 is outputted, as data 522, in the output signal Q_Out in response to the capture clock pulse 520.

At operation 455 in FIG. 4, an actual test response is unloaded from the circuit. For example, as illustrated in FIG. 5, at a timing 524 after the capture clock pulse 520, the scan enabling signal SE is set at logical "1." The actual logic state of the output node OUT latched in the flip-flop FF2 in response to the capture clock pulse 520 is outputted by the flip-flop FF2, or unloaded, in accordance with the clock signal CLK during a test response unloading period 526 when the scan enabling signal SE is at logical "1." The actual logic state of the output node OUT is outputted as an actual test response 528 in the output signal Q_Out. In some embodiments where the circuit X includes multiple outputs, the flip-flops corresponding to the outputs of the circuit X are coupled in series to sequentially unload multiple bits latched in the corresponding flip-flop circuits as the actual test response 528.

At operation 465 in FIG. 4, the unloaded, actual test response is compared with the expected test response corresponding to the test pattern for determining whether a corresponding defect exists in the circuit. For example, the controller 110 compares the actual test response 528 with an expected test response corresponding to the test pattern 512 for defect detection. When the actual test response 528 matches the expected test response corresponding to the test pattern 512, the controller 110 determines that there is no corresponding defect in the circuit X. For example, when the expected test response corresponding to the test pattern 512 is that the output node OUT has logical "0" and the actual test response 528 indicates that the actual logic state at the output node OUT after the test wait time period W0 is indeed logical "0," the controller 110 determines that there is no defect in the PMOS transistors of the circuit X. When the actual test response 528 does not match the expected test response corresponding to the test pattern 512, the controller 110 determines that there is a corresponding defect in the circuit X. For example, when the expected test response corresponding to the test pattern 512 is that the output node OUT has logical "0" and the actual test response 528 indicates that the actual logic state at the output node OUT after the test wait time period W0 is logical "1," i.e., the output node OUT has flipped due to circuit defect, the controller 110 determines that there is a defect in one or more of the PMOS transistors of the circuit X.

In some embodiments, the testing process 400 is performed to detect a defect in the NMOS transistors of the circuit X, with the following differences compared to the described testing process for detecting a defect in the PMOS transistors. A difference is that the test pattern for detecting a defect in the NMOS transistors is configured to cause the corresponding node, e.g., the output node OUT, to have logical "1." Another difference is that the test wait time period W1 for detecting a defect in the NMOS transistors is determined based on a logic state flipping time period for the output node OUT to change from logical "1" to a logical "0" due to current leakage in one or more NMOS transistors in the circuit X. In at least one embodiment, W1 is determined based on T1 described with respect to the equation (5).

In the example arrangement in accordance with some embodiments as illustrated in FIG. 5, the clock cycle or pulse width of the capture clock pulse 520 is shorter than the clock cycle or pulse width of other clock pulses of the clock signal CLK during the test pattern loading period 510 and the test response unloading period 526. The clock cycle or pulse width of the capture clock pulse 520 corresponds to an operational frequency of the circuit X which is faster than a testing frequency of the clock signal CLK during the test pattern loading period 510 and test response unloading period 526. In the example arrangement in accordance with some embodiments as illustrated in FIG. 5, the test wait time period W is determined as a number of omitted clock cycles or pulses 530, which are not supplied to the flip-flops FF1 and FF2 to permit the logic state at a node in the circuit X to flip in response to a defect in the circuit X. The omitted clock pulses 530 have the clock cycle or pulse width corresponding to the operational frequency of the circuit X. In some embodiments, the omitted clock pulses 530 and/or the capture clock pulse 520 have the clock cycle or pulse width corresponding to the testing frequency of the clock signal CLK during the test pattern loading period 510 and test response unloading period 526. Other arrangements are within the scope of various embodiments. One or more advantages and/or effects described with respect to the testing process 300 is/are achievable by the testing process 400, in accordance with some embodiments.

Figure 6:
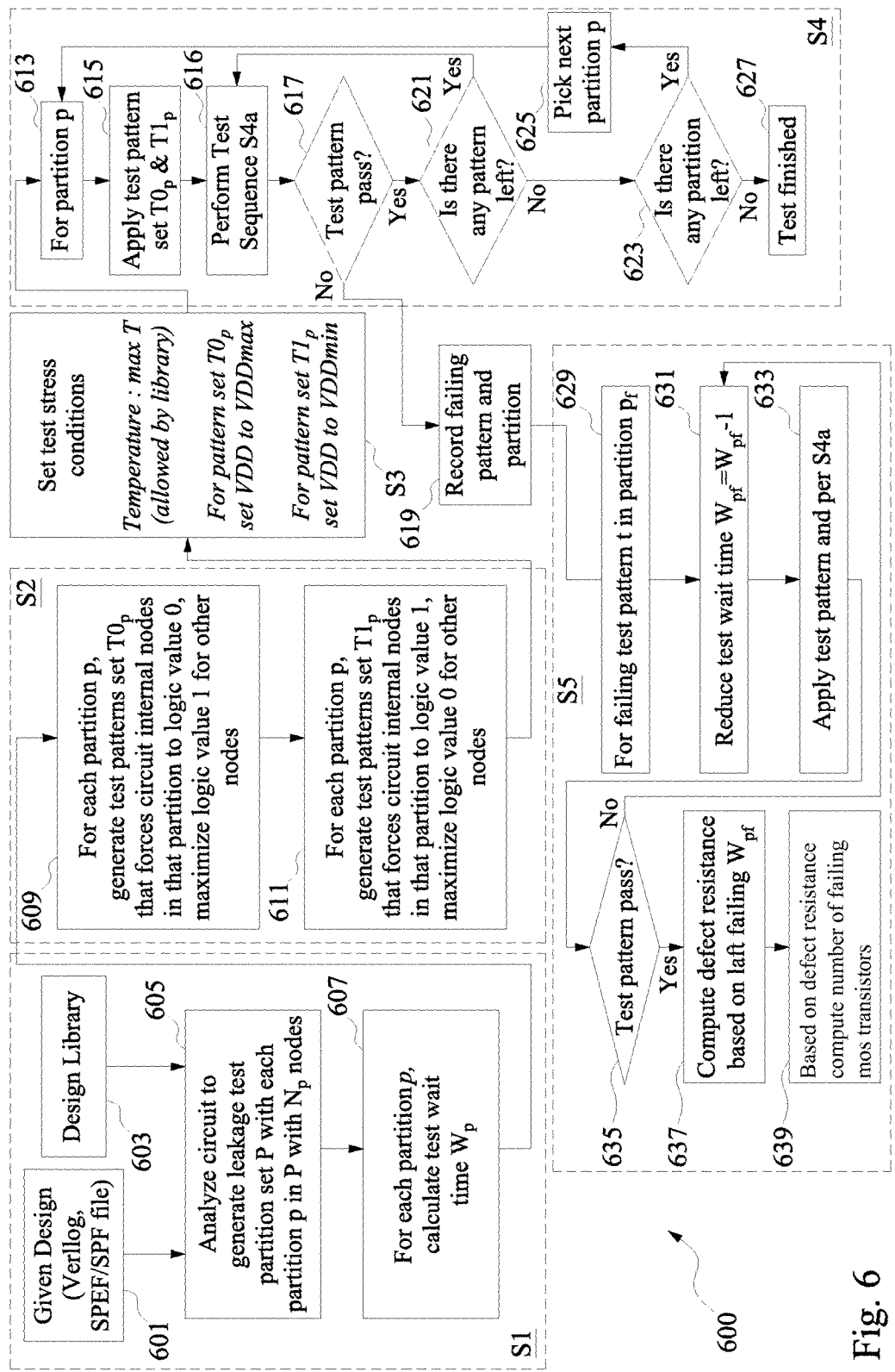
FIG. 6 is a flow chart of a testing process, in accordance with some embodiments.

FIG. 6 is a flow chart of a testing process 600, in accordance with some embodiments. In at least one embodiment, the testing process 600 is performed by the controller 110 to detect a defect in an IC. The IC comprises a plurality of circuits as described herein with respect to circuit X. In at least one embodiment, the testing process 600 is performed to detect a defect not in the whole IC, but in one or more critical paths or portions of the IC. In at least one embodiment, a path or portion of the IC is considered critical when a timing delay in the path or portion of the IC is greater than in other paths or portions of the IC. The testing process 600 comprises stages S1-S5.

As stage S1, the IC is partitioned into a plurality of partitions and test wait time periods are determined for the corresponding partitions. For example, at operation 601, a design of the IC in the form of a netlist, such as a Verilog or SPEF/SPF file, is retrieved. At operation 603, a design library including standard cells used for generating the design of the IC is consulted. The information included in the design of the IC and/or the design library provides RC information for resistances and/or capacitances of various circuits in the IC, as described with respect to FIG. 2B. Some embodiments employ other approaches for obtaining the RC information. For example, in one or more embodiments, data formats other than Verilog and SPEF/SPF are used. In some embodiments, an electronic design automation (EDA) tool is utilized to obtain the RC information, e.g., by performing an RC extraction.

At operation 605, the IC is partitioned into a plurality of partitions. For example, the obtained RC information is used to determine, for various nodes in the IC, corresponding logic state flipping time periods (also referred to herein as "flipping time periods") for the nodes to flip from one logic state to another logic state due to current leakage in the corresponding circuits containing the nodes. One or more examples for determining flipping time periods for a node to flip from logical "0" to logical "1" and vice versa is/are described with respect to one or more of FIGS. 2B-2E and/or one or more of the equations (1)-(5). Other approaches and/or equations for determining flipping time periods for various nodes are within the scope of various embodiments. The determined flipping time periods are used in one or more embodiments to partition the IC. An example of circuit partitioning based on the determined flipping time periods is described with respect to FIG. 7.

Figure 7:
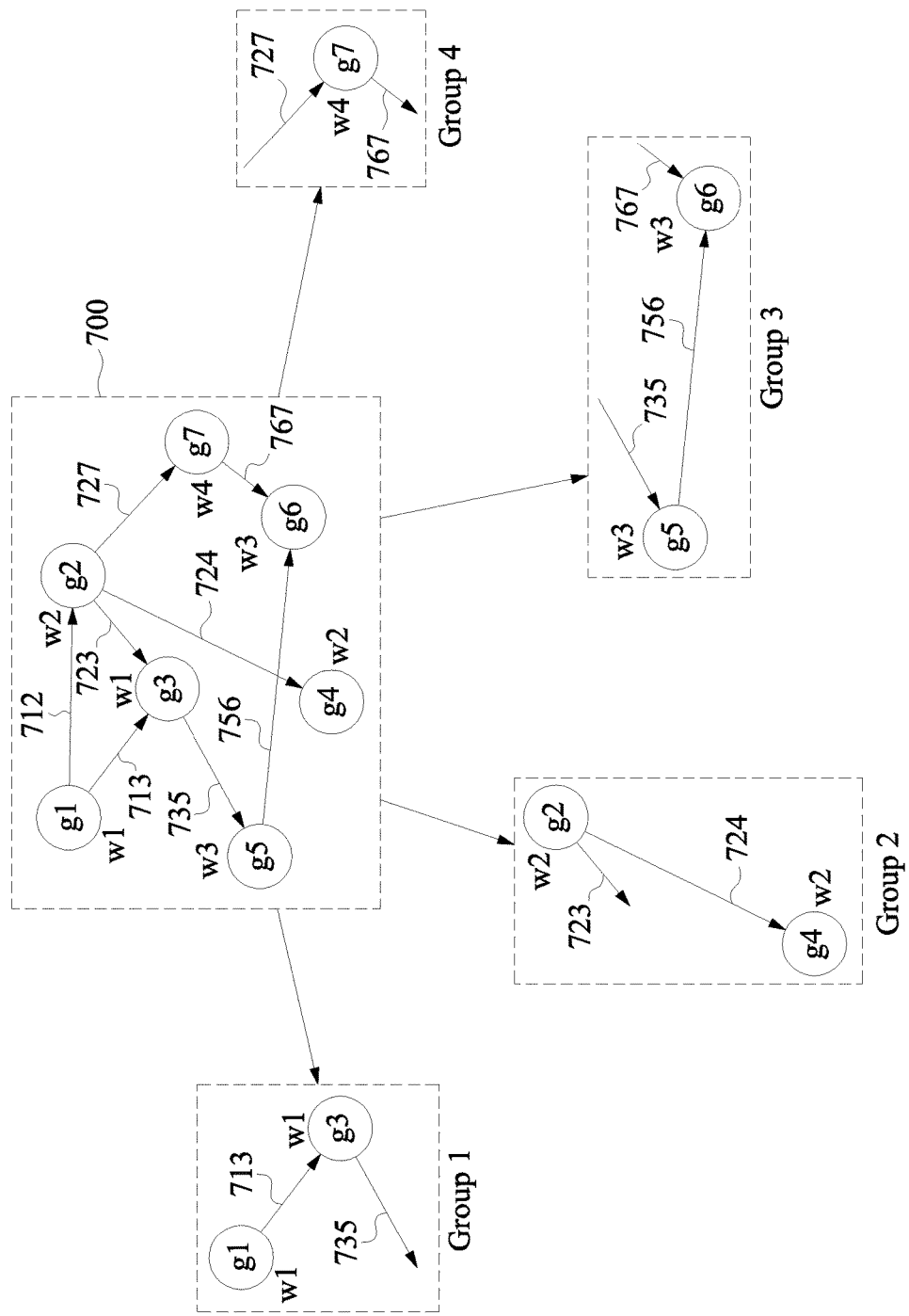
FIG. 7 is a schematic diagram showing an example of circuit partitioning, in accordance with some embodiments.

FIG. 7 is a schematic diagram showing an example of circuit partitioning, in accordance with some embodiments. In FIG. 7, a circuit portion 700 of the IC is illustrated in the form of a data flow graph. The circuit portion 700 comprises a plurality of circuits g1-g7 coupled by connections 712, 713, 723, 724, 727, 735, 756, and 767. Each of the connections is represented in the form of an arrow which indicates the data flow along the connection. For example, the connection 712 indicates the data flow from the circuit g1 to the circuit g2, the connection 724 indicates the data flow from the circuit g2 to the circuit g4, etc. For each of the circuits g1-g7, flipping time periods are determined based on the internal circuit configuration and the RC information obtained for the corresponding circuit and connections, as exemplarily described with respect to FIGS. 2B-2E.

In some embodiments, the flipping time period T0 for a node in a circuit to flip from logical "0" to logical "1" due to current leakage is considered to be the same as the flipping time period T1 for the same node to flip from logical "1" to logical "0" due to current leakage, because τ(faulty) is potentially the largest component in the equations (4)-(5) for T0 and T1. In at least one embodiment, a partitioning of the IC based on T0 values of the circuits is considered to be the same as a partitioning of the IC based on T1 values of the circuits. As a result, a common partitioning of the IC is used to detect defects both for NMOS transistors and for PMOS transistors, in accordance with some embodiments.

In some embodiments, the flipping time period T0 for a node in a circuit to flip from logical "0" to logical "1" due to current leakage is different from the flipping time period T1 for the same node to flip from logical "1" to logical "0" due to current leakage. In at least one embodiment, two different flipping time periods T0 and T1 are determined for each circuit, and a partitioning of the IC based on T0 values of the circuits is different from the a partitioning of the IC based on T1 values of the circuits. As a result, two different partitioning scheme of the IC are used to detect corresponding defects in NMOS transistors and PMOS transistors, in accordance with some embodiments. For simplicity, in the description below, the partitioning of the IC based on T0 values of the circuits is described. In at least one embodiment, described partition methodology is also applicable to partition the IC based on T1 values of the circuits.

In the example illustrated in FIG. 7, the circuits g1 and g3 have a flipping time period w1, the circuits g2 and g4 have a flipping time period w2, the circuits g5 and g6 have a flipping time period w3, and the circuit g7 has a flipping time period w4. In at least one embodiment, the circuits having the same flipping time period are grouped in to one group or partition. For example, the circuits g1 and g3 have the same flipping time period w1 and the corresponding connections 713, 735 are grouped into group 1. The circuits g2 and g4 having the same flipping time period w2 and the corresponding connections 723, 724 are grouped into group 2. The circuits g5 and g6 having the same flipping time period w3 and the corresponding connections 735, 756, 767 are grouped into group 3. The circuit g7 and the corresponding connections 727, 767 are in group 4. As a result, the portion 700 of the IC is partitioned into group 1-group 4. In at least one embodiment, two or more flipping time periods are considered to be the same when such flipping time periods correspond to the same number of clock cycles. For example, assuming that the flipping time periods for the circuits g1 and g2 are 1.2 ps and 1.3 ps. At the clock cycle of 0.5 ps of a capture clock pulse, both flipping time periods for the circuits g1 and g2 are converted to 3 clock cycles, as exemplarily described with respect to operation 405 in FIG. 4. As a result, the circuits g1 and g2 are considered to have the same flipping time period and are grouped in to the same group.

The described circuit partitioning is an example. Other arrangements are within the scope of various embodiments. For example, in at least one embodiment, one or more bin packing algorithms, such as FirstFit/BestFit, is/are used to group circuits having the same flipping time period into the same partition.

In at least one embodiment, the physical layout or location of the circuits is taken into account. For example, two circuits having the same flipping time but physically remote from each other are grouped into different partitions, in accordance with some embodiments. In at least one embodiment, the additional consideration of the physical layout or location of circuits maximizes or at least increases the effect of defect clustering.

In at least one embodiment, circuits having different, but sufficiently close, flipping time periods are grouped into the same partition. For example, circuits having flipping time periods within a first range, e.g., 3-4 clock cycles, are grouped into a first partition, whereas circuits having flipping time periods within a second range, e.g., 1-2 clock cycles, are grouped into a second partition, etc. In at least one embodiment, circuits are grouped by the time values (e.g., picoseconds or nanoseconds) of the flipping time periods, rather than by the corresponding number of clock cycles.

Returning to FIG. 6, at operation 607, a test wait time period Wp is determined for each partition p. In at least one embodiment, when the circuits having the same flipping time period are grouped in the partition p, the test wait time period Wp is the same as the flipping time period. In at least one embodiment, when the circuits having different flipping time periods are grouped in the partition p, the test wait time period Wp is the maximum or average of the different flipping time periods.

In at least one embodiment, one or more operations described with respect to stage S1 is/are omitted. In at least one embodiment, stage S1 is omitted. For example, instead of partitioning the IC into numerous partitions with numerous corresponding test wait time periods Wp, a single test wait time period W is used for testing the whole IC. In at least one embodiment, the single test wait time period W is the maximum of the flipping time periods of the circuits in the IC. In this situation, all or most leakage scenarios are covered in the testing process, with an increase in the testing time. In at least one embodiment, the single test wait time period W is the minimum of the flipping time periods of the circuits in the IC. In this situation, heavy leakage scenarios (which cause node to flip in a short time period) are covered in the testing process, with the testing time reduced. In at least one embodiment, the single test wait time period W is the average of the flipping time periods of the circuits in the IC. In this situation, a balance of testing time and test coverage is achieved. The described situations are examples. Other arrangements are within the scope of various embodiments.

At stage S2, test patterns are generated for the partitions obtained at stage S1. For example, at operation 609, for each partition p, a test pattern T0p is generated to cause internal nodes in the partition p to have logical "0." In at least one embodiment, the test pattern T0p further causes all, or a maximum number of, other nodes outside the partition p to have logical "1." For example, in the example illustrated in FIG. 7, the test pattern T0p for the group 1 in one or more embodiments causes internal nodes in circuits g1 and g3 to have logical "0," and causes other nodes in the other circuits g2 and g4-g7 to have logical "1." The test pattern T0p is to be later applied to the partition p to test for defects in PMOS transistors in the partition p. At operation 611, for each partition p, a test pattern T1p is generated to cause internal nodes in the partition p to have logical "1." In at least one embodiment, the test pattern T1p further causes all, or a maximum number of, other nodes outside the partition p to have logical "0." The test pattern T1p is to be later applied to the partition p to test for defects in NMOS transistors in the partition p. In at least one embodiment, either or both of the test pattern T0p and the test pattern T1p are generated beforehand and stored in a self-test chip. In at least one embodiment, the test pattern T0p and/or the test pattern T1p are configured to detect defects other than current leakage. In at least one embodiment, one or more operations described with respect to stage S2 is/are omitted. In at least one embodiment, stage S2 is omitted.

At stage S3, one or more stress test conditions is/are set to maximize the detectable effect caused by defects in the IC. For example, in at least one embodiment, the IC under test is physically placed in a testing environment having the maximum operational temperature permitted by the design or specification of the IC. In at least one embodiment, for detecting a defect in PMOS transistors using the test pattern T0p, the power supply voltage VDD is set to the maximum level permitted by the design or specification of the IC, for maximizing the charging current though a defective PMOS transistor. In at least one embodiment, for detecting a defect in NMOS transistors using the test pattern T1p, the power supply voltage VDD is set to the minimum level permitted by the design or specification of the IC, for maximizing the discharging current though a defective NMOS transistor. In at least one embodiment, one or more operations described with respect to stage S3 is/are omitted. In at least one embodiment, stage S3 is omitted.

At stage S4, the test patterns are applied to the corresponding partitions to detect defects in the partitions. In at least one embodiment, the test patterns determine at stage S2 are applied under the stress test conditions set at stage S3 to the corresponding partitions determined at stage S1. For example, at operation 613, a partition p is selected for testing. At operation 615, the test pattern T0p or T1p determined for the partition p is selected to be applied to the partition p. For example, the test pattern T0p is selected.

At operation 616, a test sequence S4a is performed to apply the selected test pattern T0p to the selected partition p. In at least one embodiment, the test sequence S4a corresponds to the testing process 400 described with respect to FIG. 4. In at least one embodiment, the test sequence S4a is performed under the corresponding test stress conditions set at stage S3. For example, when the test pattern T0p is to be applied, the test sequence S4a is performed at the maximum operational temperature and maximum level of the power supply voltage VDD, in accordance with some embodiments. In at least one embodiment, the controller 110 comprises a programmable counter to support individual test wait time period Wp for the corresponding partition p when performing the test sequence S4a.

At operation 617, it is determined whether the actual test response unloaded from the partition p matches the expected test response corresponding to the test pattern T0p. When the it is determined that the actual test response unloaded from the partition p matches the expected test response, the current partition and test pattern are considered passing the test and the process proceeds to operation 621. When the it is determined that the actual test response unloaded from the partition p does not match the expected test response, the current partition and test pattern are recorded as failing at operation 619. The process then proceeds to stage S5 to further analyze the failing partition. In at least one embodiment, the process returns to operation 621 to finish stage S4 before proceeding to stage S5.

At operation 621, it is determined whether there is another test pattern to be applied for the current partition p. For example, when the test pattern T0p is selected to be applied first, the process selects the test pattern T1p to be applied next at operation 621, and the test sequence S4a is performed again. In at least one embodiment, the test sequence S4a is performed to apply the test pattern T1p at the maximum operational temperature and minimum level of the power supply voltage VDD, in accordance with some embodiments. The process described with respect to operations 617 and 619 is applicable after the test sequence S4a applying the test pattern T1p. When it is determined at operation 621 that both test pattern T0p and test pattern T1p have been applied to the current partition p, the process proceeds to operation 623.

At operation 623, it is determined whether all partitions have been tested. When it is determined that not all partitions have been tested, a next partition is selected at operation 625 and the process returns to operation 613 to test the next partition. When it is determined that all partitions have been tested, the testing process terminates at operation 627 in accordance with some embodiments. In at least one embodiment, when stage S5 has not been performed for further analyzing the failing partitions, the testing process does not terminate at operation 627; rather, the process proceeds to stage S5 to further analyze the failing partition(s) recorded at operation 619.

The described testing process in which test patterns Tp0 and Tp1 are applied to the corresponding partition p before proceeding to the next partition is an example. Other arrangements are within the scope of various embodiments. For example, in at least one embodiment, the test patterns T0p (or Tp1) are applied to the corresponding partitions, and then the remaining test patterns T1p (or Tp0) are applied to the corresponding partitions. In this approach, the test stress conditions (e.g., the power supply voltage VDD set to the maximum level) are not adjusted until all test patterns (e.g., T0p) are applied to the corresponding partitions, in accordance with some embodiments. As a result, the testing time and/or procedure complexity is/are reduced, in at least one embodiment.

At stage S5, a further analysis is performed for the failing partition(s). For example, at operation 629, a failing partition pf is selected for further analysis. At operation 631, the test wait time period Wpf used in the test sequence S4a at operation 616 for testing the failing partition pf is reduced. In at least one embodiment, one clock cycle is deducted from the test wait time period Wpf, i.e., Wpf=Wpf-1. In at least one embodiment, a different number of clock cycles is deducted from the test wait time period Wpf. In at least one embodiment, the time value (e.g., measured in picoseconds or nanoseconds) of the test wait time period Wpf is reduced.

At operation 633, the test sequence S4a is performed with the reduced test wait time period Wpf. At operation 635, it is determined whether the failing partition pf has passed the test, as described with respect to operation 617. When it is determined that the failing partition pf has not passed the test even at the reduced test wait time period Wpf, the process returns to operation 631 to further reduce the test wait time period Wpf and operation 633 is performed again to apply the test sequence S4a to the failing partition pf at the further reduced test wait time period Wpf. In at least one embodiment, operations 631 and 633 are iteratively performed until the failing partition pf passes the test, or until the number of iterations or the reduced value of test wait time period Wpf indicates that the failing partition pf includes a defect that prompts one or more modifications to the design and/or the manufacturing processes of the IC.

When it is determined at operation 635 that the failing partition pf passes the test at a reduced test wait time period Wpf, the process proceeds to operation 637. At operation 637, a defect resistance of the failing partition pf is determined based on the last failing test wait time period Wpf. For example, when the failing partition pf failed the test at Wpf of 4 clock cycles, but later passed the test at reduced Wpf of 3 clock cycles, the last failing Wpf is 4 clock cycles. In at least one embodiment, the last failing Wpf is converted to a time value (e.g., measured in picoseconds or nanoseconds). The defect resistance of the failing partition pf is determined based on the last failing Wpf and the known capacitance information of the failing partition pf obtained at stage S1. For example, when the failing partition pf failed the test with the corresponding test pattern T0p at operation 616, the corresponding equation (1), i.e., $$\tau(1) = \left(R_{wire} + \frac{R_p}{NP_g}\right)C_g,$$

is used at operation 637 to derive the defect resistance $$\left(R_{wire} + \frac{R_p}{NP_g}\right)$$

based on the known capacitance information Cg, and the last failing Wpf being substituted for τ(1). In a further example, when the failing partition pf failed the test with the corresponding test pattern T1p at operation 616, the corresponding equation (2), i.e., $\tau(0)=(R_{wire}+NN_g \times R_n)C_g$, is used at operation 637 to derive the defect resistance $(R_{wire}+NN_g \times R_n)$. In some embodiments, the equation (3) is used at operation 637 to derive the defect resistance.

At operation 639, the number of defective or failing transistors is determined based on the defect resistance determined at operation 637. For example, when the failing partition pf failed the test with the corresponding test pattern T0p at operation 616, the number NPg of failing PMOS transistors (i.e., with current leakage) in the failing partition pf is determined from the defect resistance $$\left(R_{wire} + \frac{R_p}{NP_g}\right)$$

obtained in operation 637, and the resistances Rwire and Rp obtained from stage S1, in accordance with some embodiments. In another example, when the failing partition pf failed the test with the corresponding test pattern T1p at operation 616, the number NNg of failing NMOS transistors (i.e., with current leakage) in the failing partition pf is determined from the corresponding defect resistance ($R_{wire}$+$NN_g \times R_n$) obtained in operation 637, and the resistances Rwire and Rn obtained from stage S1.

In some embodiments, the determined number of failing PMOS and/or NMOS transistors in a failing partition pf is used for further analysis and/or modification. In at least one embodiment, when a ratio of defective transistors of a particular type is high, one or more modifications are made to the manufacturing processes for that particular type of transistors. For example, when 3 out of 4, or all 4, NMOS transistors in a failing partition pf are defective, it is determined that the NMOS manufacturing processes are to be modified. In at least one embodiment, when a ratio of defective transistors of a particular type is low, it is determined that the manufacturing processes for that particular type of transistors are acceptable. For example, when 1 out of 4 NMOS transistors in a failing partition pf is defective, it is determined that the NMOS manufacturing processes are acceptable, and the cause for the defect resides in the configuration of the failing partition pf and/or the design of the IC.

In at least one embodiment, the determined number of failing transistors in a failing partition pf is used to reduce or simplify the process for locating the failing transistor(s). For example, when it is determined that one NMOS transistor in a failing partition pf is defective and the design of the failing partition pf indicates that one particular NMOS transistor has a higher risk of being defective than the other NMOS transistors, it is determined in one or more embodiments, without further analysis, that the NMOS transistor with the higher risk is the failing transistor. In another example, when it is determined that one NMOS transistor in a failing partition pf is defective, a further testing is performed in one or more embodiments to test the NMOS transistors in the failing partition pf one by one. The further testing is stopped after locating the first defective NMOS transistor, without testing the remaining NMOS transistors, because it was known beforehand that the failing partition pf has one defective NMOS transistor. In some embodiments, based on the location of the defective transistor, one or more modifications is/are made to the configuration of the failing partition pf and/or the design of the IC. The described modifications and/or further analysis are examples. Other arrangements are within the scope of various embodiments.

In at least one embodiment, one or more of the operations described with respect to Stage S5 is/are omitted. In at least one embodiment, stage S5 is omitted.

One or more advantages and/or effects described with respect to the testing process 300 is/are achievable by the testing process 600, in accordance with some embodiments. In some embodiments, the defect size and/or defect location is/are obtainable as described with respect to stage S5. In some embodiments, the test patterns are automatically generated for corresponding partitions using an EDA tool.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a controller loads a test pattern into a circuit for causing an expected test response from the circuit, waits for a test wait time period, and then unload an actual test response from the circuit. The test wait time period is sufficient for the expected test response to change due to a defect in the circuit. The actual test response is compared to the expected test response to determine whether a defect exists. In some embodiments, the described test pattern is applicable to detect current leakage, without involving current measurements and/or without modifications to testing equipment and/or on-chip test structures.

Figure 8:
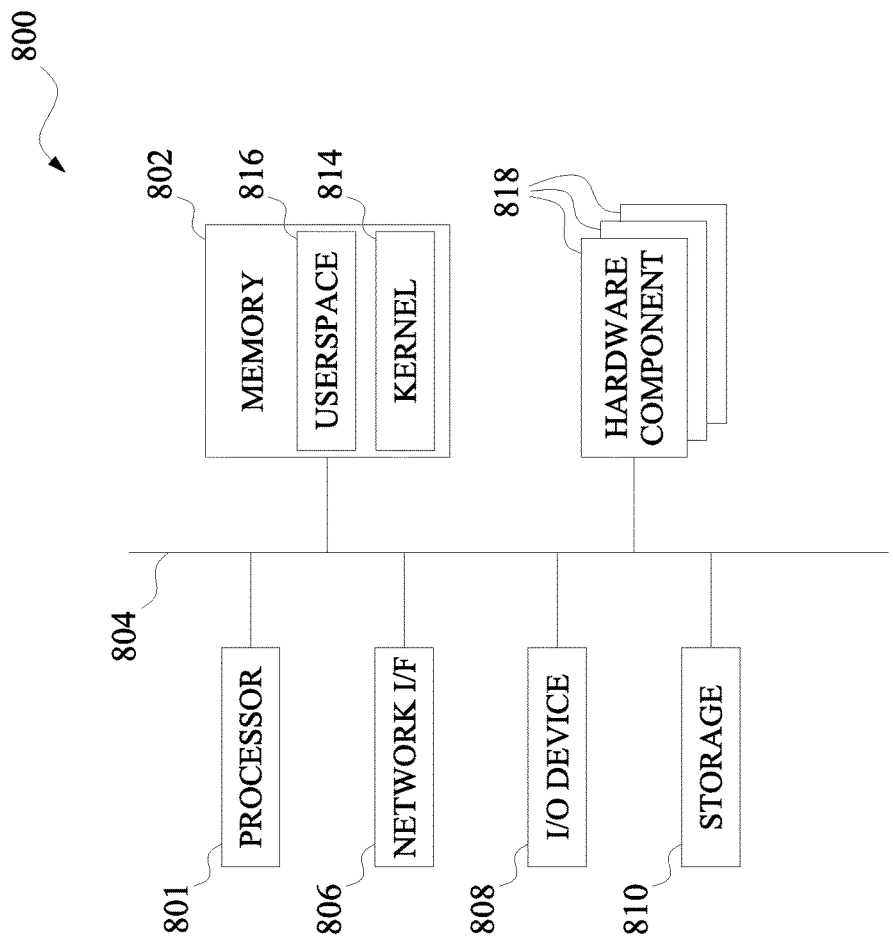
FIG. 8 is a block diagram of a computer system in accordance with some embodiments.

FIG. 8 is a block diagram of a computer system 800 in accordance with some embodiments. One or more of the tools and/or engines and/or systems and/or operations described with respect to FIGS. 1-7 is realized in some embodiments by one or more computer systems 800 of FIG. 8. The system 800 comprises at least one processor 801, a memory 802, a network interface (I/F) 806, a storage 810, an input/output (I/O) device 808 communicatively coupled via a bus 804 or other interconnection communication mechanism.

The memory 802 comprises, in some embodiments, a random access memory (RAM) and/or other dynamic storage device and/or read only memory (ROM) and/or other static storage device, coupled to the bus 804 for storing data and/or instructions to be executed by the processor 801, e.g., kernel 814, userspace 816, portions of the kernel and/or the userspace, and components thereof. The memory 802 is also used, in some embodiments, for storing temporary variables or other intermediate information during execution of instructions to be executed by the processor 801.

In some embodiments, a storage device 810, such as a magnetic disk or optical disk, is coupled to the bus 804 for storing data and/or instructions, e.g., kernel 814, userspace 816, etc. The I/O device 808 comprises an input device, an output device and/or a combined input/output device for enabling user interaction with the system 800. An input device comprises, for example, a keyboard, keypad, mouse, trackball, trackpad, and/or cursor direction keys for communicating information and commands to the processor 801. An output device comprises, for example, a display, a printer, a voice synthesizer, etc. for communicating information to a user.

In some embodiments, one or more operations and/or functionality of the tools and/or engines and/or systems described with respect to FIGS. 1-7 are realized by the processor 801, which is programmed for performing such operations and/or functionality. In some embodiments, the processor 801 is configured as specifically configured hardware (e.g., one or more application specific integrated circuits (ASICs)). One or more of the memory 802, the I/F 806, the storage 810, the I/O device 808, the hardware components 818, and the bus 804 is/are operable to receive instructions, data, design constraints, design rules, netlists, layouts, models and/or other parameters for processing by the processor 801.

In some embodiments, the operations and/or functionality are realized as functions of a program stored in a non-transitory computer readable recording medium. In at least one embodiment, the operations and/or functionality are realized as functions of a program, such as a set of executable instructions, stored in memory 802. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, a method performed at least partially by a processor comprises performing a test sequence. In the test sequence, a test pattern is loaded into a circuit. The test pattern is configured to cause the circuit to output a predetermined test response. A test response is unloaded from the circuit after a test wait time period has passed since the loading of the test pattern into the circuit. The unloaded test response is compared with the predetermined test response.

In some embodiments, a device comprises at least one processor configured to perform the following operations. A first test wait time period is determined based on a first logic state flipping time period for a node in a circuit to change from a first logic state to a second logic state due to current leakage in the circuit. A first test pattern is loaded into the circuit, the first test pattern configured to cause the node in the circuit to have the first logic state. A clock signal of the circuit is stopped for the first test wait time period. The clock signal is resumed after the first test wait time period. A first test response is unloaded from the circuit. A determination is made as to whether a current leakage exists in the circuit, based on a logic state of the node in the first test response.

In some embodiments, a computer program product comprises a non-transitory, computer-readable medium containing instructions therein which, when executed by at least one processor, cause the at least one processor to perform the following operations. A circuit is partitioned into a plurality of circuit partitions. For each circuit partition among the plurality of circuit partitions, a test wait time period is determined, a test pattern is generated to cause the circuit partition to output a predetermined test response, the test pattern is loaded into the circuit partition, a clock signal of the circuit partition is stopped for the test wait time period, the clock signal is resumed after the test wait time period, a test response is unloaded from the circuit partition after one clock pulse of the resumed clock signal, and the unloaded test response is compared with the predetermined test response to determine whether a defect exists in the circuit partition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method performed at least partially by a processor, the method comprising:
    performing a test sequence comprising:
        loading a test pattern into a circuit, the test pattern configured to cause the circuit to output a predetermined test response;
        unloading a test response from the circuit, wherein said unloading is performed after a test wait time period has passed since said loading the test pattern into the circuit;
        comparing the unloaded test response with the predetermined test response;
        determining that a defect exists in the circuit in response to said comparing indicating that the unloaded test response does not match the predetermined test response;
        reducing the test wait time period; and
        performing the test sequence at the reduced test wait time period.

2. The method of claim 1, wherein
    the test wait time period is sufficient for the predetermined test response outputted by the circuit to change in response to a defect in the circuit.

3. The method of claim 1, wherein the test sequence further comprises:
    stopping a clock signal of the circuit for the test wait time period after said loading the test pattern into the circuit; and
    resuming the clock signal after the test wait time period has passed.

4. The method of claim 3, wherein
    said unloading the test response from the circuit is performed after a first clock pulse of the resumed clock signal.

5. The method of claim 4, wherein
    a frequency of the resumed clock signal during said first clock pulse is an operational frequency of the circuit.

6. The method of claim 1, further comprising:
    iteratively reducing the test wait time period and performing the test sequence at the reduced test wait time period until the corresponding unloaded test response matches the predetermined test response; and
    determining a characteristic of the defect based on the reduced test wait time period at which the corresponding unloaded test response matches the predetermined test response.

7. The method of claim 6, wherein
    the characteristic of the defect comprises a number of defective transistors in the circuit.

8. The method of claim 1, wherein
    said test sequence is performed at a test stress condition that maximizes an effect of a defect to be detected in the circuit.

9. The method of claim 1, further comprising:
    determining the test wait time period based on a logic state flipping time period for a node in the circuit to change from a logic state to another logic state due to current leakage in the circuit.

10. The method of claim 1, further comprising:
    iteratively reducing the test wait time period and performing the test sequence at the reduced test wait time period until the corresponding unloaded test response matches the predetermined test response;
    wherein:
        the reduced test wait time period, used during a last iteration at which the corresponding unloaded test response matches the predetermined test response, is a passing test period;
        the reduced test wait time period, used during a next-to-last iteration at which the corresponding unloaded test response does not match the predetermined test response, is a last-failing test period; and
    the method further comprises:
        determining a defect resistance of the circuit based on the last-failing test period.

11. A device comprising at least one processor configured to perform:
    determining a first test wait time period based on a first logic state flipping time period for a node in a circuit to change from a first logic state to a second logic state due to current leakage in the circuit,
    loading a first test pattern into the circuit, the first test pattern configured to cause the node in the circuit to have the first logic state;
    stopping a clock signal of the circuit for the first test wait time period;
    resuming the clock signal after the first test wait time period;
    unloading a first test response from the circuit; and
    determining whether a current leakage exists in the circuit based on a logic state of the node in the first test response.

12. The device of claim 11, wherein the processor is further configured to perform:
    determining a second test wait time period based on a second logic state flipping time period for the node in the circuit to change from the second logic state to the first logic state due to current leakage in the circuit,
    loading a second test pattern into the circuit, the second test pattern configured to cause the node in the circuit to have the second logic state;
    stopping the clock signal of the circuit for the second test wait time period;
    resuming the clock signal after the second test wait time period;
    unloading a second test response from the circuit; and
    determining whether a current leakage exists in the circuit based on a logic state of the node in the second test response.

13. The device of claim 12, wherein the processor is further configured to perform:
    determining that a current leakage exists in the circuit based on at least one of
        the logic state of the node in the first test response being the second logic state, or
        the logic state of the node in the second test response being the first logic state.

14. The device of claim 12, wherein the processor is configured to perform:
    determining that a first transistor of a first type in the circuit is defective, in response to the logic state of the node in the first test response being the second logic state; and
    determining that a second transistor of a second type in the circuit is defective, in response to the logic state of the node in the second test response being the first logic state.

15. The device of claim 14, wherein
the first logic state is logical "0,"
the second logic state is logical "1,"
the first transistor of the first type is a p-channel metal-oxide semiconductor (PMOS) transistor, and
the second transistor of the second type is an n-channel metal-oxide semiconductor (NMOS) transistor.

16. The device of claim 12, wherein
the first logic state is logical "0,"
the second logic state is logical "1," and
the processor is further configured to perform:
   setting a power supply voltage of the circuit to a maximum level for testing the circuit with the first test pattern, and
   setting the power supply voltage of the circuit to a minimum level for testing the circuit with the second test pattern.

17. A computer program product comprising a non-transitory computer-readable medium containing instructions therein which, when executed by at least one processor, cause the at least one processor to:
   partition a circuit into a plurality of circuit partitions;
   for each circuit partition among the plurality of circuit partitions,
      determine a test wait time period,
      generate a test pattern configured to cause the circuit partition to output a predetermined test response,
      load the test pattern into the circuit partition,
      stop a clock signal of the circuit partition for the test wait time period;
      resume the clock signal after the test wait time period;
      unload a test response from the circuit partition after one clock pulse of the resumed clock signal; and
      compare the unloaded test response with the predetermined test response to determine whether a defect exists in the circuit partition.

18. The computer program product of claim 17, wherein the instructions, when executed by the at least one processor, further cause the at least one processor to:
   determine logic state flipping time periods for corresponding nodes in the circuit to change from a logic state to another logic state due to current leakage in the circuit; and
   group the nodes of the circuit into the plurality of circuit partitions based on the corresponding logic state flipping time periods.

19. The computer program product of claim 18, wherein the instructions, when executed by the at least one processor, further cause the at least one processor to:
   for each circuit partition among the plurality of circuit partitions,
      determine the test wait time period based on the logic state flipping time periods of the corresponding nodes in the circuit partition.

20. The computer program product of claim 17, wherein the instructions, when executed by the at least one processor, further cause the at least one processor to:
   for each circuit partition among the plurality of circuit partitions,
      determine a type of a defective transistor in the circuit partition, in response to a comparison result indicating that the unloaded test response does not match the predetermined test response.

* * * * *